United States Patent
Fainman et al.

(10) Patent No.: US 7,421,158 B2
(45) Date of Patent: Sep. 2, 2008

(54) HOLOGRAPHICALLY DEFINED SURFACE MASK ETCHING METHOD AND ETCHED OPTICAL STRUCTURES

(75) Inventors: Yeshaiahu Fainman, San Diego, CA (US); Wataru Nakagawa, Palos Park, IL (US); Chyong-Hua Chen, La Jolla, CA (US); Pang-Chen Sun, San Diego, CA (US); Lin Pang, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 348 days.

(21) Appl. No.: 10/521,425

(22) PCT Filed: Jul. 18, 2003

(86) PCT No.: PCT/US03/22608

§ 371 (c)(1),
(2), (4) Date: Mar. 22, 2005

(87) PCT Pub. No.: WO2004/010167

PCT Pub. Date: Jan. 29, 2004

(65) Prior Publication Data

US 2005/0153464 A1 Jul. 14, 2005

Related U.S. Application Data

(60) Provisional application No. 60/399,769, filed on Jul. 31, 2002, provisional application No. 60/397,005, filed on Jul. 18, 2002.

(51) Int. Cl.
*G02B 6/26* (2006.01)
*G02B 6/255* (2006.01)
*G02F 1/295* (2006.01)

(52) U.S. Cl. .............................. 385/31; 385/50; 385/8; 385/88; 385/89

(58) Field of Classification Search .................. 385/31, 385/50, 8, 88–89
See application file for complete search history.

(56) References Cited

U.S. PATENT DOCUMENTS

| | | | |
|---|---|---|---|
| 5,223,356 A | 6/1993 | Kumar et al. | |
| 6,518,194 B2 | 2/2003 | Winningham et al. | |
| 6,684,007 B2 * | 1/2004 | Yoshimura et al. | 385/31 |

OTHER PUBLICATIONS

M. Campbell et al., "*Fabrication of photonic crystals for the visible spectrum by holographic lithography*," Letters to Nature, vol. 404, Mar. 2, 2000, pp. 53-56.

(Continued)

*Primary Examiner*—Wael Fahmy
*Assistant Examiner*—Steven H Rao
(74) *Attorney, Agent, or Firm*—Greer, Burns & Crain, Ltd

(57) ABSTRACT

The invention is directed to a method for etching a solid state material to create a surface relief pattern. A resist layer is formed on the surface of the solid state material. The photoresist layer is holographically patterned to form a patterned mask. The pattern is then transferred into the solid state material by a dry etching process. The invention is especially useful for forming optical nanostructures. In preferred embodiments, a direct write process, such as ebeam lithography, is used to define defects and functional elements, such as waveguides and cavities.

21 Claims, 8 Drawing Sheets

OTHER PUBLICATIONS

S. Shoji et al., "*Photofabrication of three-dimensional photonic crystals by multibeam laser interference into a photopolymerizable resin*," Applied Physics Letters, vol. 76, No. 19, May 8, 2000, pp. 2668-2670.

P. Visconti et al. "*Nanopatterning of organic and inorganic materials by holographic lithography and plasma etching*," Microelectronic Engineering, vol. 53, 2000, pp. 391-394.

* cited by examiner

HOLOGRAPHICALLY DEFINED SURFACE MASK ETCHING METHOD AND ETCHED OPTICAL STRUCTURES

PRIORITY CLAIM

Applicants claim priority benefits under 35 U.S.C. § 119 on the basis of Patent Application No. 60/397,005, filed Jul. 18, 2002, and Patent Application No. 60/399,769, filed Jul. 31, 2002.

STATEMENT OF GOVERNMENT INTEREST

This invention was made with Government assistance under AFOSR Grant No. F49620-01-1-0497, DARPA Grant No. N66001-00-C-8075 and NSF Grant No. ECS-9912476. The Government has certain rights in this invention.

TECHNICAL FIELD

A field of the invention is device fabrication, and another field of the invention is optical devices.

BACKGROUND ART

Formation of patterns having depth and height in solid state materials remains a significant challenge where nanoscale pattern features are required. Mechanical techniques, e.g., machining, are generally unsuitable. Mask transfer techniques, electron beam lithography, and other techniques practiced to make small features are successfully conducted, but pose problems, especially when scaled-up in a manufacturing environment.

The fast growing optical devices field has an ever-growing need for nanoscale pattern features. Exposed surface relief geometries are an example. Exposed surface relief geometries are used, for example, for optical phase modulation in diffractive optical devices, as periodic nanostructures for artificial dielectrics, and as period nanostructures for photonic crystal-based devices. Semiconductor lasers also use exposed surface relief geometries, for example, as distributed Bragg reflectors, and as ridge structures for optical waveguides. In other cases, surface relief geometries are buried, i.e., they are not part of the uppermost surface of a device. These distinctions are discussed so that surface relief is understood to refer to the surface of a layer being patterned, and not necessarily the surface of an uppermost device layer.

The most commonly used procedure for fabrication of surface relief profiles pattern features is a resist and dry etching process. A resist pattern is prepared. The pattern is then transferred into a dry-etch-resistant mask layer. Dry etching transfers the pattern structure from the mask layer into the solid state material. This process becomes more difficult as feature sizes are reduced.

High resolution electron-beam lithography is widely used to realize small features by writing the pattern in E-beam resist. Tracing patterns with a controlled electron beam is, however, time consuming and costly. To obtain a hardened mask for the dry etching process, the patterns defined by an e-beam are usually transferred into a CVD (chemical vapor deposition) grown $SiO_2$ layer, and possibly additional steps to make the mask more durable. This is followed by application of the mask to the layer to be patterned, etching and liftoff. These mask transfers increase the mask durability, but the mask patterns may degrade during the transfer processes.

Others have developed techniques for the three-dimensional patterning of masks, and these holographic patterning techniques hold promise for advancement of photonic structures. See, M. Campbell et al, "Fabrication of photonic crystals for the visible spectrum by holographic lithography," Nature, 404, 53-56 (2000); S. Shoji and S. Kawata, "Photofabrication of three-dimensional photonic crystals by multi-beam laser interference into a photopolymerizable resin," App. Phy. Lett., 76, 2668-2670 (2000); and P. Visconti et al, "Nanopatterning of organic and inorganic materials by holographic lithography and plasma etching," Microelectron. Eng., 53, 391-394 (2000). The holographic techniques produce photonic structure patterns in dielectric materials. However, transferring the patterns into photonic device materials, e.g., semiconductor quality Group III-V materials such as GaAs, is problematic. For example, the Campbell et al process described in the Nature article transferred patterns from a resist by producing an inverse replica in titania. As described above, mask transfer techniques for the resist are problematic. In addition, practical devices require locally controlled variations or defects in the photonic crystal lattice. Thus, there remains a need for an improved method to form surface relief patterns in solid state materials.

DISCLOSURE OF THE INVENTION

The invention is directed to a method for etching a solid state material to create a surface relief pattern. A resist layer is formed on the surface of the solid state material. The photoresist layer is holographically patterned to form a patterned mask. The pattern is then transferred into the solid state material by a dry etching process. The invention is especially useful for forming optical nanostructures. In preferred embodiments, a direct write process, such as e-beam lithography, is used to define defects and functional elements, such as waveguides and cavities.

BEST MODE OF CARRYING OUT THE INVENTION

The invention is directed to methods to fabricate surface relief patterns in solid state materials. The invention is particularly applicable to optical devices, and is capable of producing sub-wavelength surface relief patterns, such as patterns of holes. The complexity of the fabrication methods of the invention does not increase substantially for larger sized patterns, e.g., areas extending into and beyond square millimeters. The fabrication methods of the invention are accordingly especially suited for the fabrication of optical nanostructures, including both large area and small area optical nanostructures.

Figure 1A:
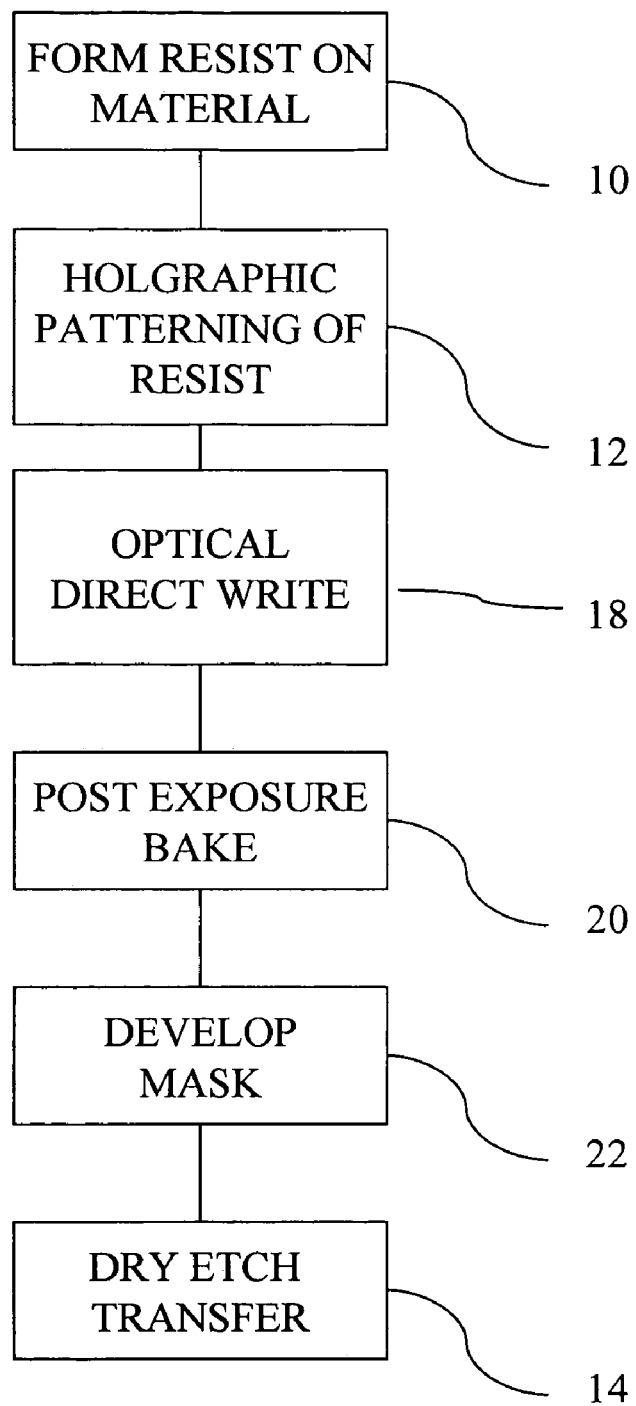
FIG. 1A is a flowchart illustrating a preferred embodiment method for etching a solid state material to create a surface relief pattern.

Referring now to FIG. 1A, a flowchart illustrates a preferred embodiment method of the invention. The method of FIG. 1A shows steps for etching a solid state material to create a surface relief pattern. The method of FIG. 1 forms a photoresist layer on the surface of the solid state material to be etched (step 10). The photoresist material is then holographically patterned to form a patterned mask (step 12). While embodiments of the invention are particularly suited to producing nanoscale and sub-wavelength optical structures, embodiments of the invention may create larger features.

The discussion will focus primarily on small feature structures, such as those required for photonic patterns. The photoresist should be a high resolution resist, defined as a resist capable of being holographically patterned to produce photonic patterns. A preferred epoxy based photoresist layer is SU-8, commonly used in micromechanical systems fabrication for patterning structures having high aspect ratios. SU-8 is a chemically amplified negative resist. SU-8 has very high optical transparency above 360 nm, making it ideally suited for achieving vertical sidewalls in thick films. Embodiments of the invention also use positive photoresist.

The mask includes a pattern having physical structure, e.g., rectangular ridges separated by rectangular valleys, after the holographic patterning. A dry etching transfers the surface relief structure of the mask into the solid state material (step 14). For the creation of optical structures, the group III-V semiconductor materials (e.g., GaAs, InP, etc.) are used, and artisans will appreciate that the surface relief patterns may be transferred into the solid state material without any mask transfer steps, which add complexity and can reduce the integrity of the pattern. It should also be noted that the solid state material may be, for example, plurality of layers and that etching may involve etching through more that one of the layers. The patterned mask may be formed on the surface of any layer or layer portion that is exposed. Subsequent layers and patterned layers may also be formed.

The holographic patterning step (step 12) will be discussed in some detail. In some instances, experimental results are discussed. While the results may illustrate additional inventive features, the particular exemplary conditions and devices do not limit the broader aspects of the invention as discussed above.

The ability to produce small features and limit the number of processing steps is important. Methods of the invention eliminate the need to for mask transfer steps, while also creating very small feature sizes. A preferred holographic patterning step uses holographic UV lithography to create a mask in SU-8 resist. Pre-development relief was investigated and used to develop optimal processing of the patterning mask in SU-8.

Referring still to FIG. 1A, the patterning step 12 is a volumetric interference of two or more collimated laser beams operated at UV wavelengths to expose a pattern in the preferred SU-8 layer that has been formed upon the surface of the solid state material to be patterned. The holographic recording can be conducted multiple times to form more complex patterns, and the interference patterns and number of beams used to form an interference pattern can be changed.

For example, the fabrication of 2-D rectangular mesh lattice resist can be achieved by doubly exposing the resist to the same interference pattern, with the second exposure occurring with the plane of the resist changed by 90°. As an additional example, a hexagonal 2-D photonic lattice can be produced in by exposing the photoresist three times to the same interference pattern with in-plane substrate rotations of 60° and 120°. Precision computer controlled movements are required to avoid distortion of the intended pattern for multiple exposure patterning.

Figure 1B:
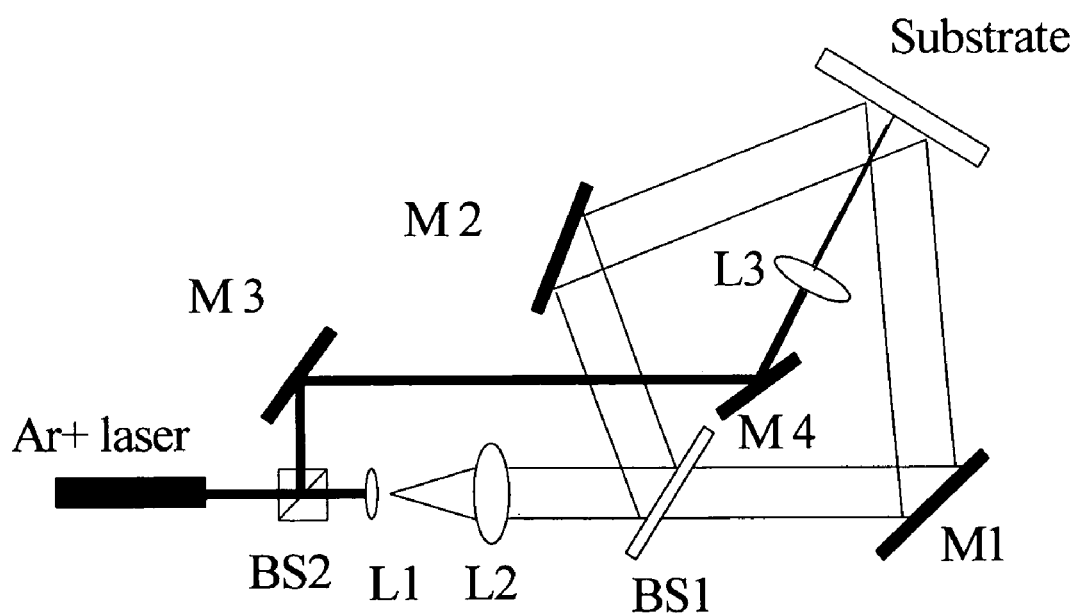
FIG. 1B is a schematic diagram of an exemplary holographic interferometric exposure set-up.

More generally, by proper choice of the rotation angles, exposure doses, and type of the UV photoresist (positive or negative) during holographic exposure, different structures and shapes may be created in the resist after development. FIG. 1B shows an exemplary interferometric exposure set-up. The two beams are then reflected onto the resist at an angle, which can be adjusted to achieve the desired period: $\lambda/(2 \sin(\theta/2))$, where $\lambda$ and $\theta$ are the wavelength of the laser and angle between the two beams, respectively. The substrate having the resist sample is mounted on a high precision translation-rotation stage. The in-plane substrate rotation allows for multiple exposure of the photoresist to the 1-D interference pattern, producing 2-D periodic structures. In FIG. 1B, the laser beam is expanded by L1, a UV objective lenses with focal length of 11.5 mm, collimated by a UV lens L2 with focal length of 100.0 mm, and is split into two equal intensity beams after beam splitter BS1 and then recombines on the resist coated on substrate. Beam splitter BS2 is used to get a scanning beam exposing the resist by a reflective microscope objective lens with focal length of 10.4 mm The set up and component specifications are provided only as an example.

In preferred embodiments, an optical direct write (step 18), with a strongly focused beam, is performed to create defects in the lattice formed by the holographic recording to implement functional devices. Point, area, and line defects may be formed. Here again, the location of the defects and their shape should be controlled by a precision computer controlled positioning stage.

Preferably, a post exposure bake (step 20) is conducted. After the patterning process or processes, the mask is developed (step 22) and a dry-etching process (step 24) is used to transfer the desired pattern into an optical material, such as GaAs. For SU-8, propylene glycol methyl ether acetate (PGMEA) may be used as a developer. The development time will depend on the thickness of the layer. After development and prior to the dry-etching (step 24), the sample may be rinsed in a solvent, e.g., isopropyl alcohol (IPA), and dried. Subsequent to the dry etching, photoresist residue may be removed by a process such as an oxygen plasma etching.

Since a large-scale photonic crystal lattice may be created at once using interferometric patterning (step 12), the optical direct-write (step 18) is used only to implement functional elements (e.g., waveguides, cavities, etc.) instead of the entire lattice. Accordingly, a reasonable processing time may be attained for patterning of large-scale photonic crystal-based integrated systems. Interferometric optical lithography differs from conventional optical lithography in the intensity profile in the volume of the photoresist as well as the thickness of the photoresist that may be used. The intensity distribution is sinusoidal due to the interference characteristics; whereas with standard optical lithography it is nearly rectangular when using a mask aligner or a stepper to expose thin layers of photoresist. Furthermore, with the interferometric optical lithography technique, the thickness of the photoresist can be optimized to meet the needs of the etching processes.

With a combination of optimal exposure dose and suitable adjustment of post exposure bake time, a good profile and a wide range duty cycle can be easily achieved. As an example, a duty cycle of 0.42 with 1 mm period was created in resist, which was also used as a dry-etching mask. A GaAs substrate sample with a fabricated SU-8 surface relief patterned mask was directly placed in a chemically assisted ion beam etching system, and a large area optical nanostructure was formed in the GaAs wafer with smooth and vertical sidewalls. Other forms of dry etching may also be used, e.g., reactive ion etching. The etching of GaAs proceeds at about 3 times the rate that the SU-8 mask is consumed. As an additional example, the methods of the invention may be used to form birefringent optical devices.

Mask pattern variations and optimizations are readily accomplished. Holographic recording is adjusted to affect the aspect ratios and duty cycle of the mask pattern. Changing the angle between the two interfering beams will introduce a period change. Changing the power per unit surface area of the holographic recording will affect the aspect ratio. Changing the exposure time will introduce a duty cycle change. The post exposure baking is altered to affect the quality of the geometric shape of the mask pattern.

An optimization study of processing parameters for fabrication of an etch mask in a SU-8 layer spin coated onto the surface of GaAs substrate was performed on larger scale features. The study used a contact print of a simple grating mask with a period of 4 mm. An Ar+ ion laser operating at a wavelength of 364 nm was used for exposure of the SU-8, as it is sensitive to near-UV radiation. For good adherence of the SU-8, the GaAs substrate was first supersonically cleaned in organic solvents and then soaked in an etchant consisting of $H_2SO_4:H_2O:H_2O_2=8:1:1$ at 50° C. for 20 seconds. Then the GaAs substrate was rinsed in deionized water, dried using $N_2$ gas, and spin coated with SU-8. The thickness of the SU-8 layer on the substrate is controlled by the spinning speed.

Before illumination, a soft bake process was performed at a temperature of 95° C. for 5min to remove all the solvent in the SU-8 layer. For exposure, we used a collimated laser beam illuminating a contact mask on the layer of SU-8. After illumination with a suitable exposure dose, we baked the sample in an oven, i.e., we performed a Post Exposure Bake (PEB) step to perform cationic photo polymerization of the epoxy. The SU-8 was then developed in propylene glycol methyl ether acetate (PGMEA), with the development time depending on the thickness of the layer. After development, the samples were rinsed in a solvent of isopropyl alcohol (IPA) and then dried in air.

We sought to determine the optimal processing parameters to achieve maximal cross-linkage in a negative photoresist such as SU-8. Exposure of a grating followed by PEB (as well as even before PEB) causes modulation of the refractive index (as well as the surface relief) in the SU-8 layer, resulting in observance of diffraction effects. We focused only on relief-type periodic structures in the SU-8 layer for the optimization study. We observed experimental structures via SEM imaging techniques. In our experiments we used a 20 mW laser output power corresponding to 1.9 $mW/cm^2$ on the resist surface. This type of surface relief grating was investigated using a 4 mm period grating mask.

Figure 2A:
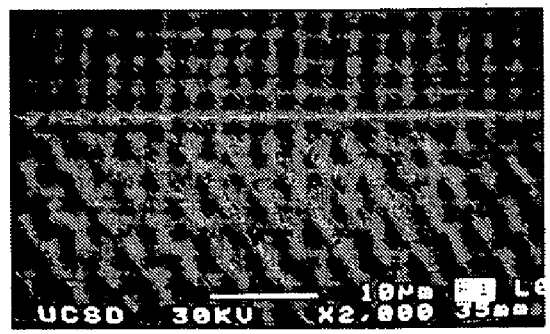
FIG. 2A is an SEM image of an experimental SU-8 pattern mask prior to development.
Figure 2B:
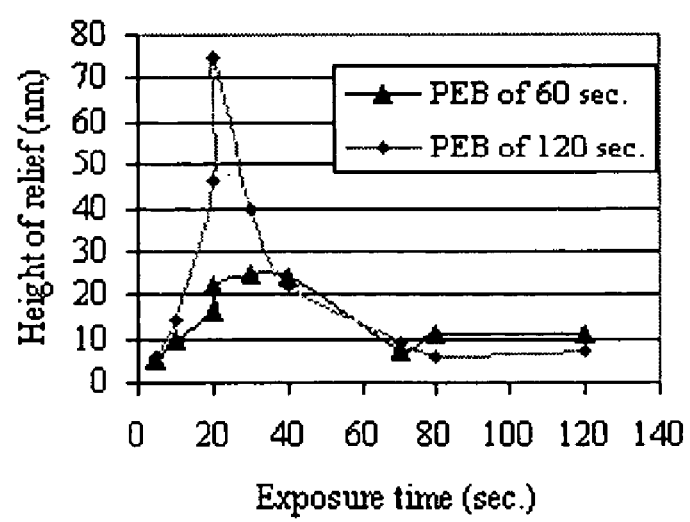
FIG. 2B is a graph illustrating the dependence of relief height on exposure time after post exposure baking of an experimental SU-8 pattern mask prior to development.

FIG. 2A shows SEM images of a surface relief resulting from exposure with the mask for 25 seconds followed by a post-exposure bake (PEB) for 120 seconds at 90° C. This SEM image was taken before developing the SU-8, and clearly shows the existence of the surface relief grating. To quantify the investigation of mask exposure times and PEB times at 90° C., we used a Dettak3ST surface profiler to measure the surface relief gratings (see FIG. 2B). The results show almost the same trend for 60 and 120 seconds PEB times: as the exposure time increases, the height of the surface relief increases to its maximum, and decreases thereafter. Additionally, the two curves display differences in the half-width exposure times for different PEB durations: the longer the PEB time, the narrower the curve becomes, indicating that an increase in the PEB time results in a higher localization in the exposure process. In the case of a 120-second bake time, the half width of the exposure time is about 15 seconds, indicating that the exposure dosage needs to be carefully controlled. In contrast, for a 60 second PEB, the half width of the exposure time is about 48 seconds, indicating that the exposure time may vary over a larger range, and the experiments will be more fault tolerant to exposure time errors. It should be noted, however, that the above-mentioned dependence of surface relief on exposure and PEB times in SU-8 is very different from that of most other negative resist materials, for which increasing exposure dosage (or time) causes the surface relief to increase gradually to a saturated value.

By comparing the mask structure and the pre-development surface relief in SU-8, we also observed that the exposed areas are thicker than the unexposed ones. This may be attributed to diffusion of the monomers from unexposed to exposed areas, as the monomers in the exposed areas are consumed or polymerized. In both chemically amplified negative resists such as SU-8 and other negative resists, however, the polymerization and diffusion processes take place under different circumstances. In a conventional negative resist, cross-linking takes place during the illumination step, whereas the diffusion process of monomers in a glassy state (i.e., under glass transition temperature) is slow. The increased cross-linking in exposed areas will make diffusion more difficult, and cross-linking or pre-development relief will tend to saturate. In contrast, in SU-8, the exposure generates induced acid (i.e., Lewis acid), which speeds up the cross-linking of monomers in PEB. During the PEB process, the induced acid catalyzes the formation of cross-linking at high temperature (90° C.). In addition, at temperatures higher than the glass transition temperature, ($\sim$55° C.), the resist layer transforms into a rubbery state, allows monomers diffuse very easily. Thus, the combination of catalyst acid and the effective diffusion of monomers in SU-8, makes the cross-linking process in the exposed areas more efficient.

We developed the exposed structures to verify the quality of the developed SU-8 masks. The best experimental runs revealed that a post exposure bake of 60sec at 90° C. provided a larger effective exposure region in comparison to that of 120 sec for our experimental arrangement In addition, an exposure power of 35 to 90 $mJ/cm^2$ proved best.

Figure 3:
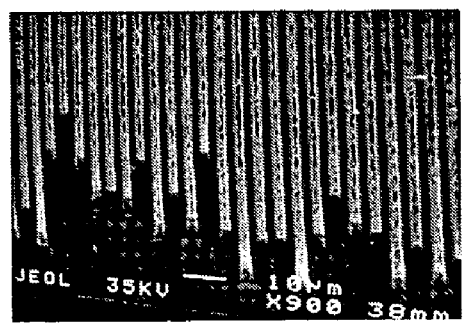
FIG. 3 is an SEM image of an example SU-8 patterned mask having a grating of a 4 μm period after exposure for 35 seconds and development for 60 seconds.

FIG. 3 shows a SEM image of the mask structure after development. The sample SU-8 mask was exposed through a contact mask for 35 seconds, (i.e., 66 mJ/cm2) and baked for 60 seconds at 90° C. The grating is 3.2 mm thick with a duty cycle of 0.56. The duty cycle of the grating is defined as the ratio of the grating tooth width to the period. It is easy to achieve a structure of several microns in SU-8, using a contact mask.

Smaller features may also be achieved by using a SU-8 patterning that does not use a contact mask. The fabrication of large aspect ratio nanostructures in a solid state substrate such as GaAs requires etch-resistant masks with large aspect ratios on a nanoscale. Fabrication of sub-wavelength nanoscale mask structures cannot be accomplished using existing contact printing techniques due to diffraction effects that limit resolution. However, by using volumetric interference of two collimated laser beams (i.e., holographic recording), operating at an UV wavelength, it is possible to create small features in thick layers of photosensitive material such as SU-8. Furthermore, the period and the duty cycle of the periodic structure can be adjusted by changing the angle between the two beams and the exposure time, respectively.

In our experiments, we used an argon laser source operated at a wavelength of 364 nm. The SU-8 samples were exposed in a setup producing an interference pattern and the exposed samples were baked following the post exposure bake process discussed above regarding the contact mask produced samples. The baked samples were developed using standard SU-8 developer and developing procedures, 1.5 mm period nanostructures were produced.

Figure 4A:
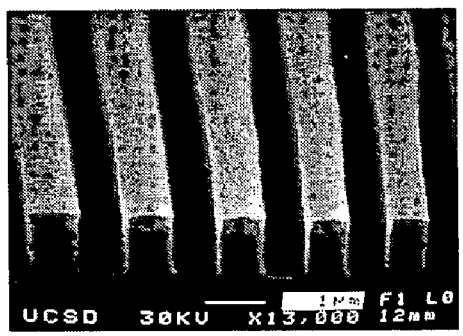
FIGS. 4A and 4B are SEM images of experimental SU-8 masks produced with exposures of 30 mJ/cm$^2$ and 58 mJ/cm$^2$.
Figure 4B:
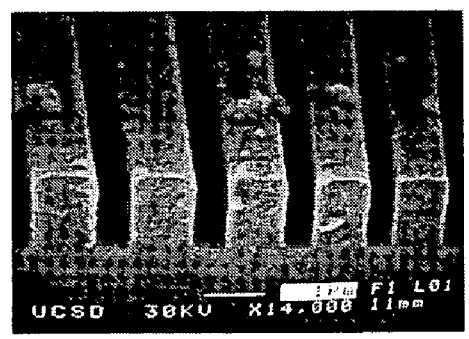
Figure 4C:
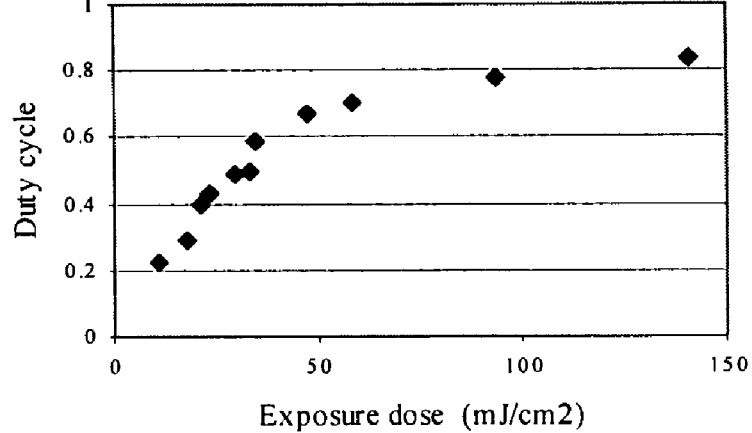
FIG. 4C is a graph summarizing experiments regarding the effect of exposure times upon duty cycles.

FIGS. 4A and 4B are SEM images of an experimental SU-8 mask showing that duty cycles of 0.5 and 0.7 can be achieved using exposures of 30 mJ/cm$^2$ and 58 mJ/cm$^2$, respectively. An experimental study of the duty cycle vs. exposure is summarized in FIG. 4C, showing that the duty cycle increases with exposure and then saturates to one. Some SU-8 residue is visible. This can be removed, for example, by oxygen plasma etching.

Figure 5A:
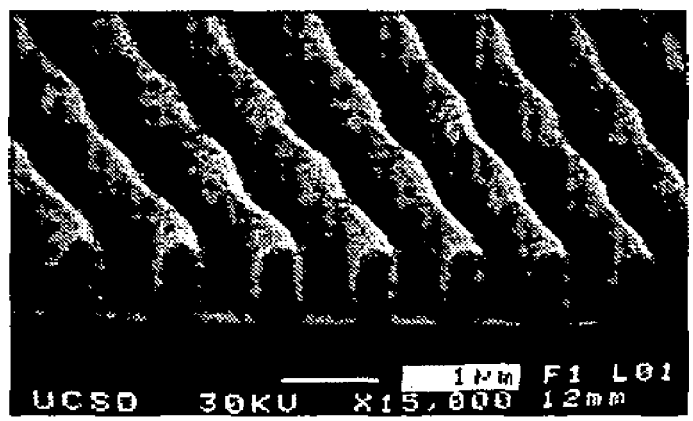
FIGS. 5A and 5B show SEM images of SU-8 masks with duty cycles of 0.44 and 0.69 produced using exposures of 25 mJ/cm$^2$ and 60 mJ/cm$^2$, respectively.
Figure 5B:
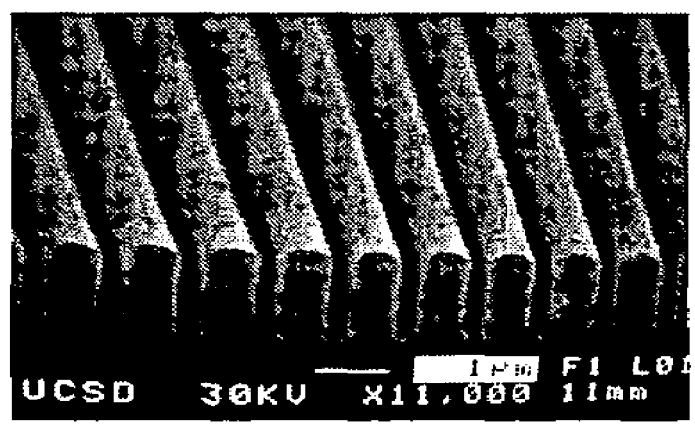

We also tested the effects of adjusting the angle between the two interfering beams used in holographic recording see that SU-8 could be used for fabrication of smaller features by simply adjusting the angle between the two interfering beams. The experiment produced a grating with period of 1.0 mm. We used a PEB of SU-8 for 60 seconds at 90° C., similar to that discussed and used above. FIGS. 5A and 5B show SEM images of SU-8 masks with duty cycles of 0.44 and 0.69 produced using exposures of 25 mJ/cm$^2$ and 60 mJ/cm$^2$, respectively.

Exposure has an effect on duty cycle, but other changes may be necessary when exposure is changed. For example, a small duty cycle cannot be achieved simply by reducing the exposure power as the quality of the resulting mask will be poor. This occurs because the exposed areas are only weakly cross-linked before development. Increasing the exposure can enhance the cross-linking of the exposed areas, but leads to increased duty cycle due to the sinusoidal intensity distribution and diffusion of the induced acid. Achieving a high quality rectangular profile with the desired duty cycle simultaneously will require adjusting other parameters as discussed below.

According to the mechanism of a chemically amplified resist, prolonging the bake time can enhance cross-linking, but also will lead to increased acid diffusion length. Decreasing exposure dose and prolonging the PEB time should be a solution to improve the gratings profile with small duty cycle. Although prolonging the PEB time will decrease the region of effective exposure, it maybe the most effective way to fabricate SU-8 masks with a very small duty cycle and high quality geometric profile. Generally, cross-linking in SU-8 is not a linear function of PEB time: when increasing the cross-linking of SU-8 by increasing PEB time instead of exposure dose, slight differences in exposure time, and non-uniformity of the intensity distribution, will strongly affect the structure of the gratings.

Figure 6A:
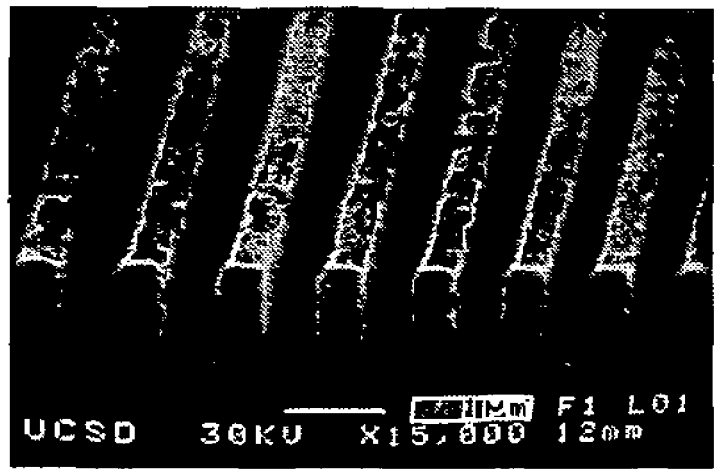
FIG. 6A is an SEM image that shows an example of an SU-8 mask with 1 mm period at small duty cycle of 0.42 that was achieved using an exposure of 19 mJ/cm$^2$ and PEB time of 300 seconds at 90° C.

FIG. 6A shows an example of an SU-8 mask with 1 mm period at small duty cycle of 0.42 that was achieved using an exposure of 19 mJ/cm$^2$ and PEB time of 300 seconds at 90° C. The result of FIG. 6A indicates that by modifying PEB bake time, it is possible to decrease the duty cycle while keeping good profile geometry.

Figure 6B:
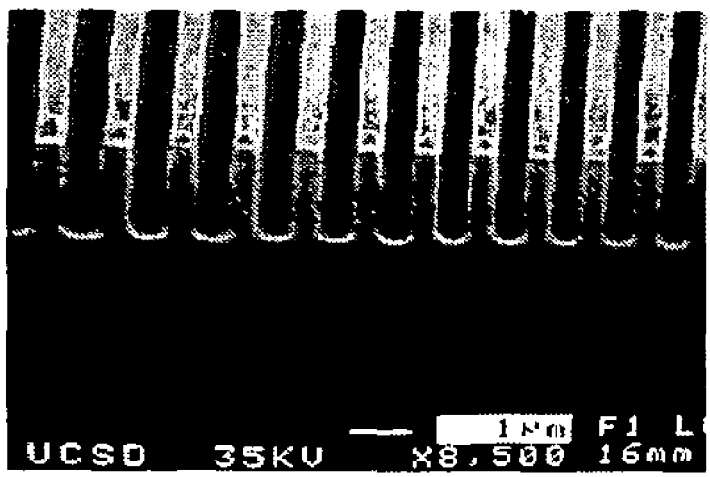
FIG. 6B is an SEM image that shows an optical nanostructure formed in GaAs using the FIG. 6A mask.

Production of optical nanostructures made in SU-8 into an optical semiconductor, such as GaAs, was also investigated. We tested the methods of the invention for its ability to produce an optical nanostructure. We spin coated a GaAs wafer with SU-8 resist and fabricated a periodic nanostructure using the procedures discussed above. The GaAs wafer with the fabricated SU-8 mask was directly placed into the chamber of chemically assisted ion beam etching (CAIBE) system for etching. In CAIBE, $Cl_2$ is used as a chemical etching gas. The etching rate and profile are influenced by many parameters in the system, such as beam voltage, accelerator voltage, beam current and gas flow of $Cl_2$, etc. With optimized dry-etching parameters, a rectangular etched profile was achieved in the GaAs, as seen in FIG. 6B. The erosion rate of the resist and the etching rate of GaAs are 5 nm/min and 16 nm/min, respectively, such that the etching rate selectivity is greater than 3:1. The GaAs optical nanostructure in FIG. 6B has a period of 1 mm and a depth of about 1.5 mm. There is some SU-8 residue on the GaAs substrate due to incomplete removal.

To estimate the resolution of the masks fabricated with UV holographic lithography, we fabricated a periodic nanostructure with a period of 500 mn. In our experiments, the mechanical stability of such structures over a large area with high aspect ratios was suspect due to capillary force that occurs during the drying after development. Drying methods which reduce the capillary forces, e.g., supercritical resist drying methods, will eliminate the structure collapse problem for high aspect ratio-large area devices. We simply lacked the expensive equipment to demonstrate this in our laboratory.

Figure 7:
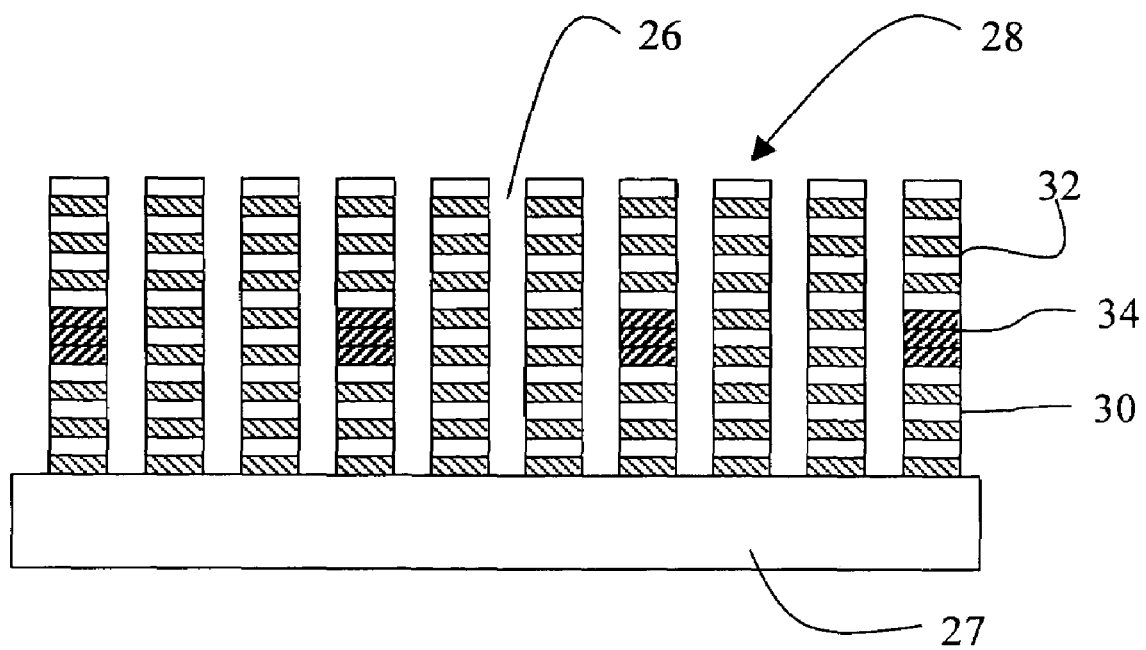
FIG. 7 is a schematic cross-section diagram of a spectral filter of the invention.

Another particular optical structure of the invention is a spectral filter having a wide field-of-view. An exemplary embodiment is shown in FIG. 7. The filter includes a linear array of nanocavities 26 formed on a substrate 27. The nanocavities 26 are formed by etching a multi-layer structure 28 with alternating layers 30, 32 having different refractive indices. The multi-layer structure 28 also includes an occasional defect 34, for example having a third refractive index. The defect is a perturbation of the refractive index of the layer structure introduced periodically, e.g., every third period in a central portion of the multi-layer structure, and may be formed as a direct write patterning step as growths and regrowths of the layers build-up the multilayer structure. After the layers are formed, etching to create the nanocavities is performed in accordance with the invention by holographic patterning of photoresist to create a mask followed by dry etching. As described above, various photonic lattice patters may be created. The alternating refractive indices of the layers 30, 32 is created, for example, by lateral oxidation after creating of the nanocavities 26. If for example, if the layers are alternating GaAs/AIAs, the lateral oxidation will alter the refractive index of the AIAs layers. As a non-limiting example, a physical embodiment of the FIG. 7 structure includes the following parameters: a multilayer period of $0.3394\lambda$, width of multilayer structures separated by the nanocavities being 27.6% of the multilayer period, the distance between two layers 30 of the same index of $0.3044\lambda$, the thickness of a layer 32 being 32.9% of the distance between two layers 30, the number of layers between defects (vertically) of 7, and a period of the defect being 3 times the period of the multilayers. In the example, alternating layers had refractive indices of 3.48 and 1.44, and the defect has a refractive index of 3.00. The methods of fabrication discussed above are well suited toward producing embodiments of the invention in accordance with FIG. 7. Exemplary physical embodiments of the FIG. 7 filter exhibit high transmissivity and reduced angular sensitivity (for example a transmissivity of 0.5 for incidence angles up to approximately +/−30°.

Figure 8A:
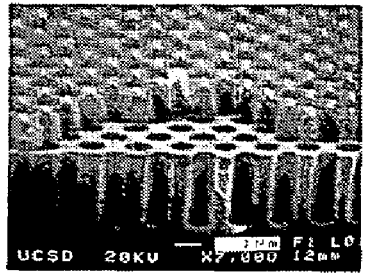
FIGS. 8A-8D are SEM images that show example 2-D photonic crystal structures formed using multiple holographic exposures at different angles to produce a hexagonally shaped lattice, formed in accordance with the invention in an SU-8 mask and then transferred into a GaAs substrate using chemically assisted ion beam etching.
Figure 8B:
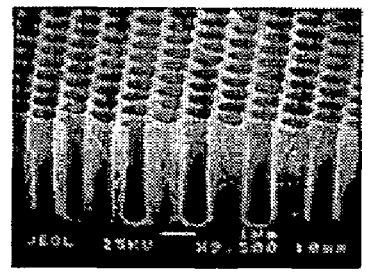
Figure 8C:
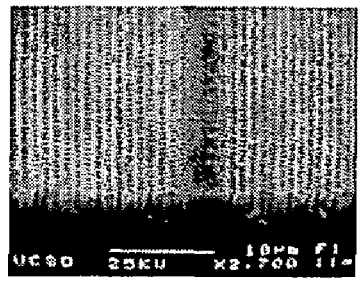
Figure 8D:
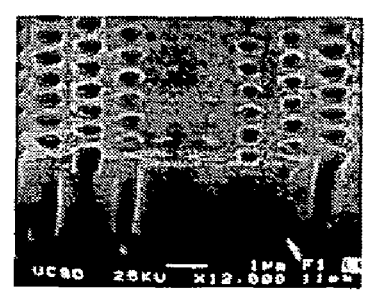

Multiple exposed samples have also been produced experimentally, showing that 2-D photonic patterns can be created. FIGS. 8A-8D are SEM images that show example 2-D photonic crystal structures formed using multiple holographic exposures at different angles to produce a hexagonally shaped lattice, formed in accordance with the invention in an SU-8 mask and then transferred into a GaAs substrate using chemically assisted ion beam etching. FIG. 8A shows an example photonic structure with a lattice period of 1.5 µm and a 3 µm depth. FIG. 8B shows an example photonic structure with a lattice period of 1 µm with a 3 µm depth. FIG. 8C shows an example photonic structure that includes a line defect. The line defect had been defined by an optical direct write in an SU-8 mask after multiple holographic exposures to produce the hexagonally shaped lattices. FIG. 8D is a magnified view of the FIG. 8C example.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for etching a solid state material to create a surface relief pattern, the method comprising steps of:
   forming a photoresist layer on the surface of the solid state material;
   holographically patterning the photoresist layer to form a patterned mask;
   transferring the pattern in the patterned mask into the solid state material by dry etching.

2. The method of claim 1, wherein the photoresist comprises SU-8.

3. The method of claim 1, wherein said step of forming comprises spin coating the photoresist layer.

4. The method of claim 1, wherein further comprising a step of, subsequent to said step of holographically patterning, optically direct writing a defect into the patterned mask.

5. The method of claim 4, wherein said step of holographically patterning comprises:
   conducting a first volumetric interfering of at least two beams; and
   after changing the position of the solid state material and the photoresist layer, conducting a second volumetric interfering of at least two beams.

6. The method of claim 4, wherein said step of holographically patterning comprises changing the angle between two interfering beams used in the holographically patterning to introduce a period change in the periodic pattern.

7. The method of claim 4, wherein said step of holographically patterning comprises changing the exposure time during the holographically patterning to introduce a duty cycle change in the periodic pattern.

8. The method of claim 4, further comprising steps of:
   post-exposure baking the photoresist layer exposed by said steps of holographically patterning and optically direct writing; and
   developing the photoresist layer form the patterned mask.

9. The method of claim 8, comprising optimizing said steps t holographically patterning and post-exposure baking to increase aspect ratios of the mask pattern transferred into the photoresist layer and to increase the quality of the geometric shape of the mask pattern.

10. The method of claim 9, wherein optimizing said step of holographically patterning comprises adjusting exposure power per unit surface area.

11. The method of claim 9, wherein optimizing said step of holographically patterning comprises determining an optimal exposure time.

12. The method of claim 8, further comprising preliminary soft baking, performed immediately prior to said step of holographic patterning.

13. The method of claim 8, performed to create a sub-wavelength optical structure.

14. The method of claim 8, performed to create an optical grating having sub-wavelength spacing between grating elements.

15. The method of claim 8, wherein the exposure power in said step of holographic recording is in the range of 35 to 90 mJ/cm$^2$.

16. The method of claim 1, performed to create a sub-wavelength optical structure.

17. The method of claim 1, performed to create an optical grating having sub-wavelength spacing between grating elements.

18. The method of claim 1, wherein the solid state material comprises a semiconductor quality Group III-V material layer.

19. The method of claim 1, wherein the solid state material comprises GaAs.

20. A spectral filter, comprising:
    a substrate (27);
    a multi-layer structure (28) having layers (30, 32) with alternating refractive indices;
    nanocavities (26) etched into the multi-layer structure; and
    periodic defects (34) in the multi-layer structure periodically interrupting the alternating refractive indices.

21. A method for forming a photonic lattice pattern in a semi-conductor crystal:
    forming a photoresist layer on the semi-conductor crystal;
    exposing the photoresist layer by volumetric interference of at least two beams that create an interference pattern in the photoresist layer to expose a photonic lattice pattern;
    creating at least one defect in the photonic lattice pattern by optical direct writing;
    developing the photoresist layer to form a mask; and
    dry etching to pattern the semiconductor material and remove the mask.

* * * * *

UNITED STATES PATENT AND TRADEMARK OFFICE
CERTIFICATE OF CORRECTION

PATENT NO. : 7,421,158 B2 Page 1 of 1
APPLICATION NO. : 10/521425
DATED : September 2, 2008
INVENTOR(S) : Fainman et al.

It is certified that error appears in the above-identified patent and that said Letters Patent is hereby corrected as shown below:

In the Specification:

Col. 3   Line 65   After the word "need", please delete the word "to".

Signed and Sealed this

Second Day of June, 2009

JOHN DOLL
*Acting Director of the United States Patent and Trademark Office*